United States Patent
Huffaker et al.

(10) Patent No.: US 7,700,395 B2
(45) Date of Patent: Apr. 20, 2010

(54) HYBRID INTEGRATION BASED ON WAFER-BONDING OF DEVICES TO ALSB MONOLITHICALLY GROWN ON SI

(75) Inventors: Diana L. Huffaker, Albuquerque, NM (US); Larry R. Dawson, Albuquerque, NM (US); Ganesh Balakrishnan, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 596 days.

(21) Appl. No.: 11/622,306

(22) Filed: Jan. 11, 2007

(65) Prior Publication Data

US 2007/0275492 A1    Nov. 29, 2007

Related U.S. Application Data

(60) Provisional application No. 60/757,869, filed on Jan. 11, 2006.

(51) Int. Cl.
*H01L 21/00* (2006.01)

(52) U.S. Cl. .............. 438/46; 438/455; 438/457

(58) Field of Classification Search ............ 438/46, 438/455–459, 479
See application file for complete search history.

(56) References Cited

U.S. PATENT DOCUMENTS

| | | | |
|---|---|---|---|
| 6,074,892 A * | 6/2000 | Bowers et al. ............... 438/57 |
| 6,316,332 B1 * | 11/2001 | Lo et al. .................... 438/455 |
| 6,370,179 B1 * | 4/2002 | Deppe et al. ................ 372/96 |
| 6,406,795 B1 * | 6/2002 | Hwang et al. ............... 428/457 |
| 6,465,803 B1 * | 10/2002 | Bowers et al. ............... 257/21 |
| 6,927,147 B2 * | 8/2005 | Fitzgerald et al. ........... 438/458 |
| 7,049,627 B2 * | 5/2006 | Vineis et al. ................ 257/18 |
| 7,288,423 B2 * | 10/2007 | Huffaker et al. ............. 438/46 |
| 7,407,863 B2 * | 8/2008 | Hsieh et al. ................. 438/406 |
| 7,432,175 B2 * | 10/2008 | Huffaker et al. ............. 438/479 |
| 7,528,002 B2 * | 5/2009 | Samuelson et al. .......... 438/94 |
| 2003/0189963 A1 * | 10/2003 | Deppe et al. ................ 372/96 |
| 2004/0013155 A1 * | 1/2004 | Burak ....................... 372/96 |
| 2007/0160100 A1 * | 7/2007 | Huffaker et al. ........ 372/45.01 |
| 2007/0201522 A1 * | 8/2007 | Huffaker et al. ............. 372/39 |
| 2007/0275492 A1 * | 11/2007 | Huffaker et al. ............. 438/46 |
| 2008/0206966 A1 * | 8/2008 | Huffaker et al. ............. 438/479 |
| 2008/0258133 A1 * | 10/2008 | Seong ....................... 257/14 |

* cited by examiner

*Primary Examiner*—Laura M Menz
(74) *Attorney, Agent, or Firm*—MH2 Technology Law Group

(57) ABSTRACT

Exemplary embodiments provide a semiconductor fabrication method including a combination of monolithic integration techniques with wafer bonding techniques. The resulting semiconductor devices can be used in a wide variety of optoelectronic and/or electronic applications such as lasers, light emitting diodes (LEDs), photovoltaics, photodetectors and transistors. In an exemplary embodiment, the semiconductor device can be formed by first forming an active-device structure including an active-device section disposed on a thinned III-V substrate. The active-device section can include OP and/or EP VCSEL devices. A high-quality monolithic integration structure can then be formed with low defect density through an interfacial misfit dislocation. In the high-quality monolithic integration structure, a thinned III-V mating layer can be formed over a silicon substrate. The thinned III-V substrate of the active-device structure can subsequently be wafer-bonded onto the thinned III-V mating layer of the high-quality monolithic integration structure forming an optoelectronic semiconductor device on silicon.

9 Claims, 4 Drawing Sheets

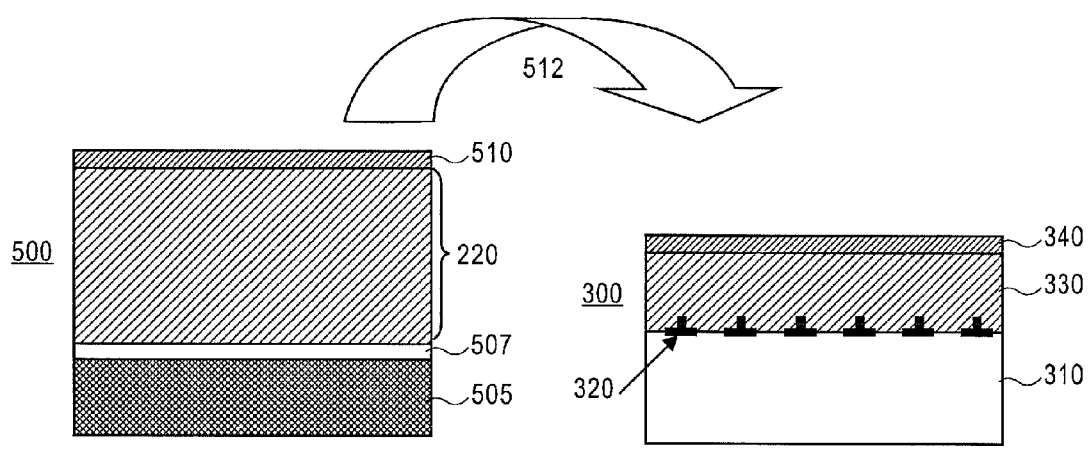
FIG. 5A  FIG. 5B
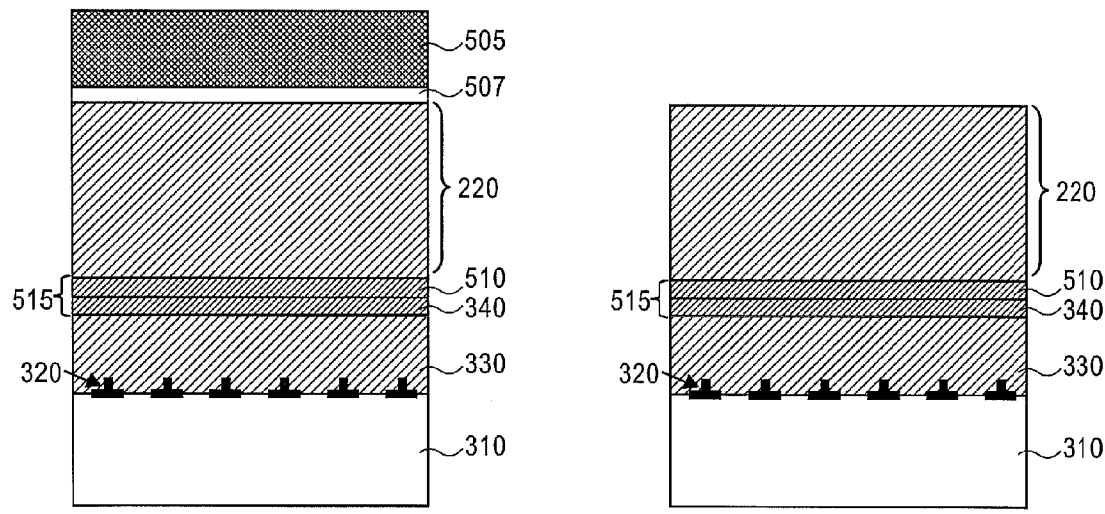
FIG. 5C  FIG. 5D

HYBRID INTEGRATION BASED ON WAFER-BONDING OF DEVICES TO ALSB MONOLITHICALLY GROWN ON SI

RELATED APPLICATIONS

This application claims priority from U.S. Provisional Patent Application Ser. No. 60/757,869, filed Jan. 11, 2006, which is hereby incorporated by reference in its entirety.

GOVERNMENT RIGHTS

This invention was made with government support under Contract No. ZR 62J awarded by the Air Force Office of Scientific Research, and Contract No. ZR55N awarded by the Army Research Office. The government has certain rights in the invention.

FIELD OF THE INVENTION

This invention relates generally to semiconductor devices and fabrication methods and, more particularly, to integrated devices and methods for device integration.

BACKGROUND OF THE INVENTION

It has been a long-standing desire of the microelectronics and telecommunications industries to combine optoelectronic components with silicon (Si) circuitry. A conventional solution for this combination includes a hybrid integration of optical components with Si integrated circuits (ICs). However, monolithic integration of optoelectronics with Si circuitry is far superior to the hybrid integration for several reasons. Monolithic integration yields more compact devices; lower packaging costs; lower processing costs; and improved device characteristics in applications where hybrid integration yields undesirable electrical parasitics.

It is therefore desirable to create a monolithically integrated structure containing both optoelectronic functionality and Si CMOS circuitry. However, an intrinsic problem with integrating optoelectronics functionality into Si chips is that Si itself is not a good optically-active (i.e., optoelectronic) material as it neither emits nor detects light efficiently. Generally, optically-active materials can include group IV or III-V semiconductor materials such as GaAs, InP, AlGaAs, InGaAs, InGaAsP for the optoelectronic functionality of the device. Due to the large lattice mismatch and thermal expansion coefficient mismatch between these materials and Si, monolithically integrated devices have been performance limited by the resulting crystalline defects (e.g., threading dislocations) from epitaxy. However, recent progress in defect filtering schemes includes graded buffer layers or epitaxial lateral overgrowth to enable the creation of lattice-mismatched epitaxial layers of suitable quality for optoelectronic devices.

Thus, there is a need to overcome these and other problems of the prior art and to provide techniques for high-quality monolithic integration of optically-active materials on silicon.

SUMMARY OF THE INVENTION

According to various embodiments, the present teachings include a method for forming a semiconductor device. In this method, the semiconductor device can be formed by first forming an active-device structure including an active-device section formed on a III-V substrate, which can subsequently be thinned. A high-quality monolithic integration structure can then be formed through an interfacial misfit dislocation, wherein the high-quality monolithic integration structure can include a thinned III-V mating layer formed on a III-V nucleation layer formed on a silicon substrate. The thinned III-V substrate of the active-device structure can then be wafer-bonded onto the thinned III-V mating layer of the high-quality monolithic integration structure to form the semiconductor device.

According to various embodiments, the present teachings also include a method for forming a semiconductor device. In this method, an active-device structure can be formed including a first thinned III-V mating layer formed on an active-device section formed on a supporting substrate. A high-quality monolithic integration structure can then be formed through an interfacial misfit dislocation, wherein the high-quality monolithic integration structure can include a second thinned III-V mating layer formed on a III-V nucleation layer formed on a silicon substrate. The semiconductor device can subsequently be formed by wafer-bonding the first thinned III-V mating layer of the active-device structure onto the second thinned III-V mating layer of the high-quality monolithic integration structure and exposing the active-device section by removing the supporting substrate.

According to various embodiments, the present teachings further include a method for forming a semiconductor device. In this method, a VCSEL device on a GaSb substrate can be epitaxially formed, wherein the VCSEL device can include an optically-pumped VCSEL and an electrically-pumped VCSEL. The GaSb substrate of the VCSEL device can then be thinned. In this method, a structure including a thinned GaSb mating layer on an AlSb nucleation layer formed on a silicon substrate, can then be monolithically formed through an interfacial misfit dislocation for a low defect density. The thinned GaSb mating layer can have a thickness of about 100 Å or less. The semiconductor device can then be formed by wafer-bonding the thinned GaSb substrate of the VCSEL device onto the thinned GaSb mating layer formed on the AlSb nucleation layer on the silicon substrate.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

FIGS. 5A-5D depict another exemplary wafer-bonding process for integrating an active-device structure with the monolithic integration structure depicted in FIG. 3 in accordance with the present teachings.

DESCRIPTION OF THE EMBODIMENTS

Figure 1:
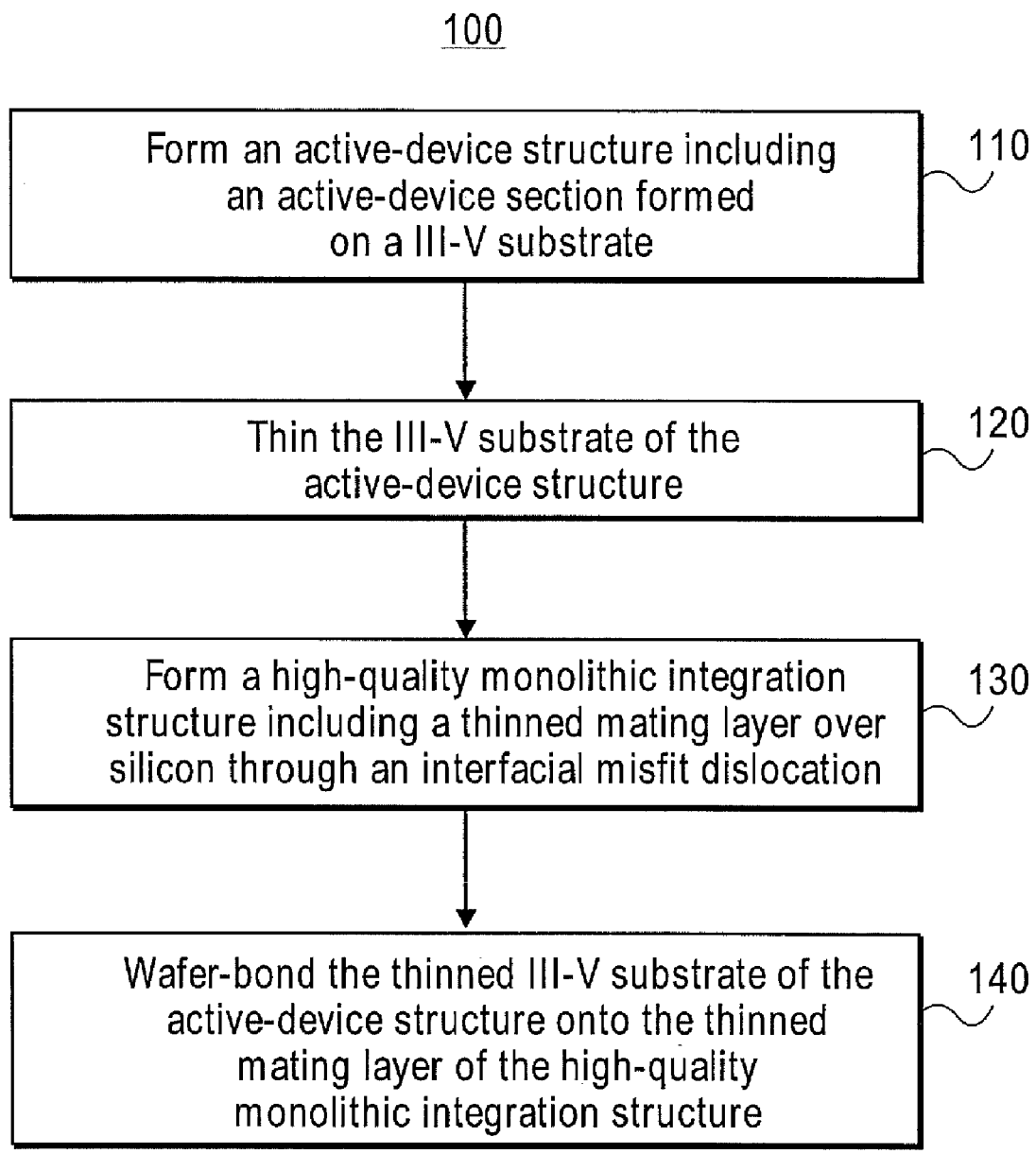
FIG. 1 depicts an exemplary method for fabricating semiconductor devices using a combination of monolithic integration techniques and wafer-bonding techniques in accordance with the present teachings.

Reference will now be made in detail to the present embodiments (exemplary embodiments) of the invention, an example of which is illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Exemplary embodiments provide a fabrication technique including a combination of monolithic Integration techniques with wafer bonding techniques for semiconductor devices. The semiconductor devices can be used in a wide variety of opto-electronic and/or electronic applications, such as, for example, lasers, light emitting diodes (LEDs), phototvoltaics, photodetectors, and transistors.

The monolithic integration structure can include optically-active materials (e.g., group III-V materials) formed on Si substrates. The monolithic integration structure can be formed with high-quality through the use of an interfacial misfit dislocation formed at the interface of lattice mismatched layers, i.e., between the optically-active material and the silicon substrate. For example, the high-quality monolithic integration structure can be formed having low defect densities of about $10^6$ cm$^{-2}$ or less, and having a strain relief of about 98% or higher.

An active-device structure can be wafer-bonded onto the monolithic integration structure forming a wafer-bonded semiconductor device. Because the wafer-bonded semiconductor device does not need to be entirely formed on the silicon substrate, a variety of active-devices can be formed onto a single silicon wafer and each of the active-devices can be single domained. For example, an exemplary single silicon wafer can include active-devices such as a laser, an LED and a photodetector formed thereon side by side.

Furthermore, the combination of monolithic integration techniques and wafer bonding techniques can avoid the thermal mismatch issue, which has plagued past attempts at integrating optically-active materials with Si substrate.

In various embodiments, the disclosed semiconductor devices can be formed by a variety of crystal growth (i.e., epitaxy) methods including, but not limited to, metal-organic chemical vapor deposition (MOCVD), molecular-beam epitaxy (MBE), gas source MBE (GSMBE), metal-organic MBE (MOMBE), atomic layer epitaxy (ALE), hydride vapor phase epitaxy (HVPE), or organometallic vapor phase epitaxy (OMVPE).

In various embodiments, the semiconductor devices can include one or more materials selected from the group consisting of materials systems of group III-V, II-VI, VI, III and/or IV. For example, III-V materials system such as semiconductor alloy compositions can be used for the disclosed semiconductor devices. In this materials system, examples of the group III elements can include Ga, In or Al, which can be formed from exemplary respective group III precursors, such as trimethylgallium (TMGa) or triethylgallium (TEGa), trimethylindium (TMIn) or trimethylaluminum (TMAl). In the III-V materials system, exemplary group V elements can include As, Sb, N, or P. According to various embodiments, exemplary group V precursors, such as ammonia, tertiarybutylphoshine (TBP), or arsine (AsH$_3$) can be used to provide elements such as N, P or As.

In the following description, semiconductor alloy compositions can be described by a combination of elements, such as, for example, GaSb, InSb, GaAs, InP, GaN, InAs, AlAs, AlGaAs, AlGaSb, or InGaSb. Generally, the elements in a composition can be combined with various molar fractions. For example, the semiconductor alloy composition InGaSb can stand for In$_{(x)}$Ga$_{(1-x)}$Sb, where the molar fraction, x, can be any number less than 1.00.

FIG. 1 depicts an exemplary method for fabricating semiconductor devices using a combination of monolithic integration techniques and wafer bonding techniques in accordance with the present teachings. The semiconductor devices can therefore include opto-electronic and/or electronic devices formed on silicon to make use of CMOS technology.

As shown in FIG. 1, at 110, active-devices such as a vertical-cavity device can be formed on an optically-active substrate such as a group III-V substrate. In various embodiments, the exemplary vertical-cavity device can include a VCSEL (i.e., vertical-cavity surface emitting laser) device formed on a III-V substrate including, but not limited to, GaSb, GaAs or InP. Generally, a VCSEL device can include an active region sandwiched between two mirrors, such as distributed Bragg reflector (DBR) mirrors. Depending on the form of pumping energy utilized to operate the VCSEL device (i.e., to cause the active region to begin to emit photons), the VCSEL device can be electrically-pumped (EP) (by a DC or an AC), or optically-pumped (OP).

At 120, the III-V substrate can be thinned by removing a portion of III-V material from the substrate until a desired thickness can be obtained depending on various applications. In various embodiments, the III-V substrate can be thinned by a mechanical planarization (such as, grinding), an etching process, or a combination of both. Alternatively, a chemical mechanical polishing step (e.g., CMP) can be performed to remove, for example, grind damage to the thinned III-V semiconductor substrate to provide a no-defective appearance.

Figure 2:
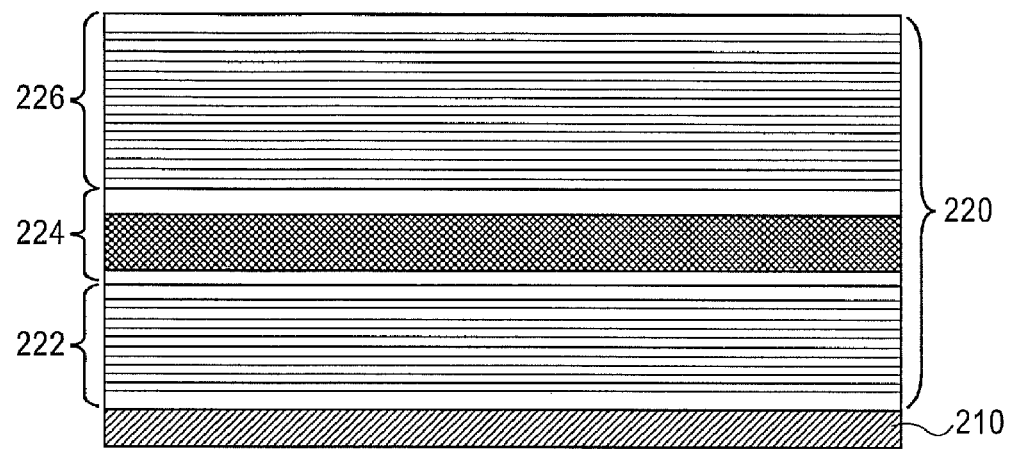
FIG. 2 depicts an exemplary active-device structure in accordance with the present teachings.

FIG. 2 depicts an exemplary active-device structure 200 in accordance with the present teachings. It should be readily apparent to one of ordinary skill in the art that the structure 200 depicted in FIG. 2 represents a generalized schematic illustration and that other layers may be added or existing layers may be removed or modified.

As shown, the active-device structure 200 can include a thinned III-V substrate 210 such as a thinned substrate of GaSb, GaAs or InP, and an active-device section 220 such as a VCSEL device stacked on the thinned III-V substrate 210.

The exemplary VCSEL active-device section 220 can be a layered structure including a first distributed Bragg reflector DBR 222, an active region 224, and a layer 226, which can usually be a second DBR mirror. As illustrated in FIG. 2, the first DBR 222 of the VCSEL active-device section 220 can be formed on the III-V substrate 210. The active region 224 can be disposed between the first DBR 222 and the layer 226 (or the second DBR).

In an exemplary embodiment, the first DBR 222 can include, for example, alternating layers of such as AlSb and AlGaSb, GaAs and AlGaAs, or GaAs and AlAs. The active region 224 can be a multiple quantum well (MQW) active region formed over the first DBR 222. The active region 224 can include alternating layers of a quantum well (QW) and a barrier layer. The active region QWs can include a material selected from the group consisting of GaSb, InGaSb, AlGaSb and InSb. Exemplary barrier layer can include AlSb, GaSb, AlGaSb, or InAlSb. The layer 226 can be a second DBR formed on the active region 224. The second DBR can include, for example, alternating layers of such as AlSb and AlGaSb, GaAs and AlGaAs, or GaAs and AlAs.

In various embodiments, the layer 226 can be a spacer layer or a cap layer, and a dielectric DBR can be deposited thereon, or an external mirror can be used. These are known to one of ordinary skill in the art.

In some embodiments, the exemplary VCSEL active-device section 220 can include an optically-pumped (OP) VCSEL device, in which a pump laser can be used. In the OP VCSEL device, the absorption layer of the active region 224 (e.g., QWs, or barrier layers) can have a bandgap smaller than the photon energy of the pump laser. In various embodiments, an anti-reflection coating can be formed on top of the exemplary OP VCSEL active-device section 220, i.e., on the surface of the layer 226.

In other embodiments, the exemplary VCSEL active-device section 220 can include an electrically-pumped (EP) VCSEL device. In the EP VCSEL device, materials of the device need to be appropriately doped on both sides of the active region 224, for example, to form a p-i-n structure, to form electrical contacts to both the p-doped and n-doped layers for carrier injection, and to form a current confinement structure to limit the injected current to the desired laser device area, which are known to one of ordinary skill in the art.

Referring back to FIG. 1, at 130, a high-quality monolithic integration structure can be formed on a silicon substrate through an interfacial misfit dislocation. As used herein, the term "interfacial misfit dislocation" can also refer to "a plurality of arrays of misfit dislocations" as described in the related U.S. patent application Ser. No. 11/622,262, entitled "Misfit Dislocation Forming Interfacial Self-Assembly for Growth of Highly-Mismatched III-Sb Alloys," which is hereby incorporated by reference in its entirety.

The interfacial misfit dislocation (i.e., the plurality of arrays of misfit dislocations) can be formed at the interface between the highly (lattice) mismatched semiconductor layers, where a strain including a compressive and/or a tensile strain can be generated. In various embodiments, the interfacial misfit dislocation can be a network of misfit dislocations, which can include semiconductor species (e.g., atoms such as Sb-atoms) assembled at the mismatched interface. In various embodiments, the interfacial misfit dislocation can be a 2-D array laterally propagated (i.e., 90° from the surface normal) on the surfaces of the semiconductor layers, i.e., at the mismatched interface, to release the strain energy. In addition, the interfacial misfit dislocation can be periodic and uniform. It should be noted that the interfacial dislocations do not thread vertically into the layered material.

The interfacial misfit dislocation can therefore be used to form high-quality III-V layers on silicon substrates without any buffer layer or epitaxial lateral overgrowth as used in the prior art. The high-quality monolithic integration structure can be formed in plane with low defect densities and be strain relieved through the interfacial misfit dislocation. For example, the high-quality monolithic integration structure can provide a defect density of about $10^6$ cm$^{-2}$ or less and a strain relief of about 98% or higher.

Figure 3:
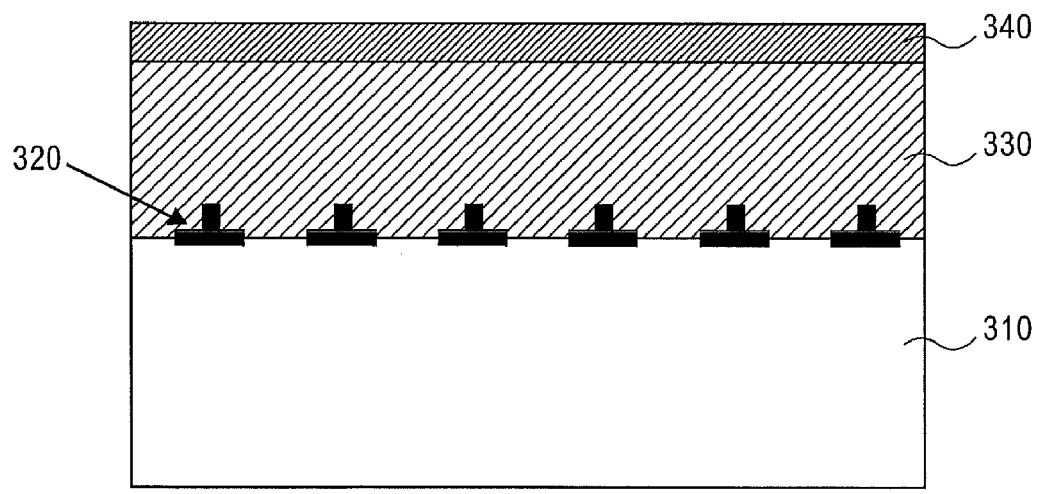
FIG. 3 depicts an exemplary high-quality monolithic integration structure including optically-active III-V layers formed on a silicon substrate in accordance with the present teachings.

FIG. 3 depicts an exemplary high-quality monolithic integration structure 300 including optically-active III-V layers formed on a silicon substrate in accordance with the present teachings. It should be readily apparent to one of ordinary skill in the art that the structure 300 depicted in FIG. 3 represents a generalized schematic illustration and that other layers may be added or existing layers may be removed or modified.

As shown in FIG. 3, the monolithic integration structure 300 can include a silicon substrate 310, an interfacial misfit dislocation 320, a III-V nucleation layer 330, and a mating layer 340. The mating layer 340 can be disposed on the III-V nucleation layer 330, which can be disposed on the silicon substrate 310. The interfacial misfit dislocation 320 can be disposed at the interface between the III-V nucleation layer 330 and the silicon substrate 310.

The III-V nucleation layer 330 can be formed with high-quality on the silicon substrate 310 through the interfacial misfit dislocation 320. Specifically, the III-V nucleation layer 330 can be formed on the silicon substrate 310 by first forming the interfacial misfit dislocation 320 on the surface of the silicon substrate 310 and the interfacial misfit dislocation 320 can then continue to grow to form the III-V nucleation layer 330.

In an exemplary embodiment, the III-V nucleation layer 330 can be a thin AlSb layer nucleated on the Si substrate 310, which relieves almost the entire strain (e.g., 98% or higher) caused by the lattice mismatch (i.e., about 13%) between the Al—Sb and the silicon via an interfacial 2-D array of 90° misfit dislocations (i.e., the interfacial misfit dislocation). The AlSb nucleation layer can have a low defect density of, for example, about $8\times10^5$ cm$^{-2}$ or less, which can enable a wide variety of opto-electronic and electronic devices on silicon substrates to make use of Si CMOS technology.

The mating layer 340 can be a second high-quality III-V layer formed on the high-quality III-V nucleation layer 330. In various embodiments, the mating layer 340 can include one or more materials selected from the group consisting of materials systems of group III-V, II-VI, VI, III and IV, for example, III-Sb materials such as GaSb, InSb, GaAs, InP, InAs, AlAs, AlGaAs, InGaSb, and III-N materials such as GaN. In various embodiments, the mating layer 340 can use similar material to the III-V substrate 210 of the active-device structure 200, for example, the mating layer 340 can be a GaSb layer.

In various embodiments, the mating layer 340 can be thinned using the methods described herein including one or more of a mechanical planarization (grinding), an etching process, a chemical mechanical polishing (e.g., CMP) to provide a surface planarity for the subsequent wafer-bonding process. The thinned mating layer 340 can have a thickness of, for example, about 100 Å or less. In various embodiments, such thickness can prevent the monolithic integration structure 300 from forming micro-cracks during a cooling process of the formation due to the minor thermal mismatch between the mating layer 340 and the III-V layer 330 on the silicon 310, for example, between GaSb and AlSb/Si.

Referring back to FIG. 1, at 140, a wafer-bonding process can be used to integrate the active-device structure 200 and the monolithic integration structure 300 to form an exemplary optoelectronic semiconductor device. Specifically, the thinned III-V substrate 210 of the active-device structure 200 can be bonded onto the thinned III-V mating layer 340 of the monolithic integration structure 300 as shown in FIG. 4.

Figure 4B:
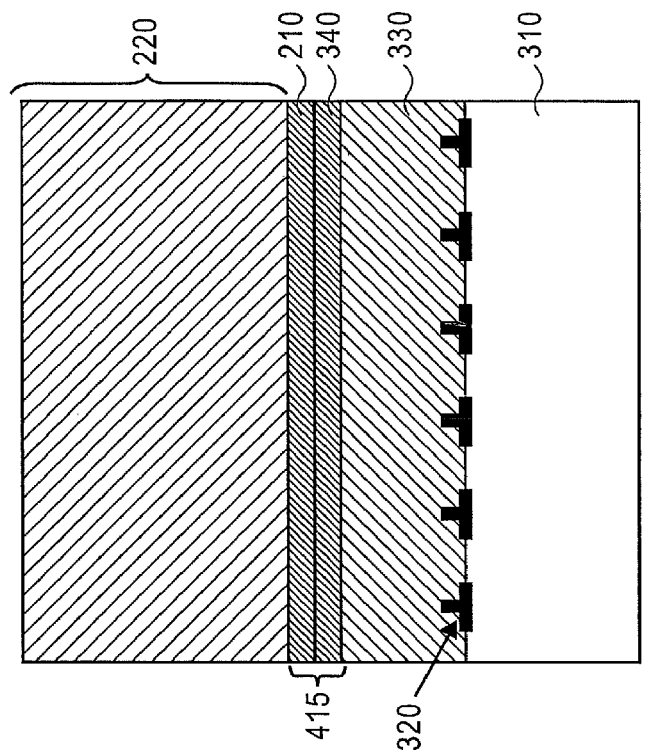
FIGS. 4A-4B depict an exemplary wafer-bonding process for integrating the active-device structure depicted in FIG. 2 with the monolithic integration structure depicted in FIG. 3 in accordance with the present teachings.
Figure 4A:
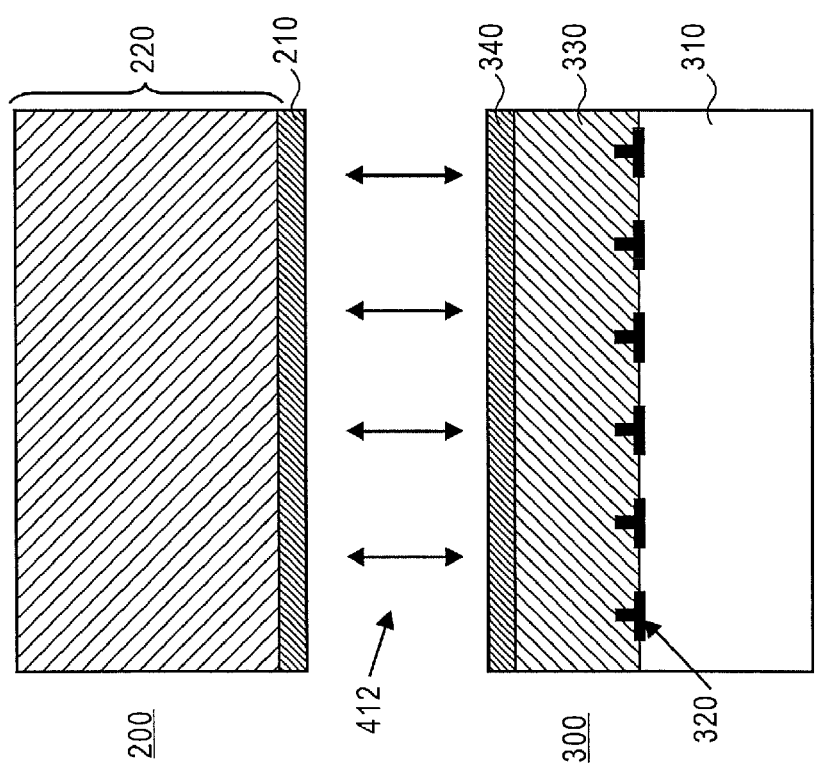

FIGS. 4A-4B depict an exemplary wafer-bonding process to integrate the active-device structure 200 depicted in FIG. 2 with the monolithic integration structure 300 depicted in FIG. 3 in accordance with the present teachings. It should be readily apparent to one of ordinary skill in the art that the devices/structures depicted in FIG. 4 represent a generalized schematic illustration and that other layers/structures/devices may be added or existing layers/structures/devices may be removed or modified.

In FIG. 4A, the active-device structure 200 can be mounted to the monolithic integration structure 300 with the thinned III-V substrate 210 physically contacting the thinned III-V mating layer 340 as illustrated at 412.

In FIG. 4B, a wafer-bonding process can thereafter be applied to the mounted structures, which causes the thinned III-V substrate 210 and the thinned III-V mating layer 340 to bond together forming a bonded layer 415. Exemplary bonding processes can include one or more processes of a hydrophilic bond, an anodic or thermo-anodic bond, and/or a heating process known to one of ordinary skill in the art. In an exemplary embodiment, a thinned GaSb can be used for both the III-V substrate 210 of the active-device structure 200 and the III-V mating layer 340 of the monolithic integration structure 300 for a high-quality GaSb—GaSb bonding interface.

FIGS. 5A-5D depict another exemplary wafer-bonding process for integrating an active-device structure 500 with the monolithic integration structure 300 depicted in FIG. 3 in accordance with the present teachings.

In FIG. 5A, the active-device structure 500 can include a supporting substrate 505, an etch-stop layer 507, an active-device section 220, and a second III-V mating layer 510. The etch-stop layer 507 can be formed between the supporting substrate 505 and the active-device section 220. The second III-V mating layer 510 can be formed on the active-device section 220 as described in FIG. 2 and FIG. 4.

In various embodiments, the supporting substrate 505 can include a V-III material, such as, for example, GaSb, GaAs or InP known to one of ordinary skill in the art. The second III-V mating layer 510 can be a wafer-bonding layer, which can include a thinned III-V material used for the mating layer 340 as described in FIG. 3.

At 512, the active-device structure 500 can then be turned upside down (with respect to the monolithic integration structure 300) to mount the second thinned III-V mating layer 510 to the thinned mating layer 340 of the monolithic integration structure 300 shown in FIG. 5B.

In FIG. 5C, various wafer-bonding processes as described herein with respect to, for example, FIG. 4A-4B, can be used to bond the active-device structure 500 and the monolithic integration structure 300 through the thinned III-V mating layer 510 and 340 creating a bonded layer 515.

In FIG. 5D, after the wafer-bonding step in FIG. 5C, selective etching processes can be performed to remove the supporting substrate 505 and the etch-stop layer 507 to expose the active-device section 200 of the structure 500 including either an OP or EP VCSEL device. For example, the supporting substrate material 505 can be first etched by an etchant that does not etch the etch-stop layer 507, followed by an etchant that etches away the etch-stop layer 507 without etching or damaging the epitaxial layers of the active-device section 220.

It should be noted that the resulting semiconductor devices shown in FIG. 5D and FIG. 4B can output laser beams from different mirrors of the active-device section 220 for an exemplary VCSEL device shown in FIG. 2. For example, for the resulting semiconductor device shown in FIG. 5D, the output laser beam can be emitted from the first DBR 222 side in the section 220 (shown in FIG. 2) and thus the first DBR 222 can be an exit mirror. For the resulting semiconductor devices shown in FIG. 4B, the output laser beam can be emitted from the second DBR 226 side in the section 220 (shown in FIG. 2) and thus the second DBR 226 can be an exit mirror. Generally, the exit mirror can have slightly lower reflectance (i.e., reflectivity) than the other mirror.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a semiconductor device comprising:
   forming an active-device structure comprising an active-device section formed on a III-V substrate;
   thinning the III-V substrate of the active-device structure;
   forming a high-quality monolithic integration structure through an interfacial misfit dislocation, wherein the high-quality monolithic integration structure comprises a thinned III-V mating layer formed on a III-V nucleation layer formed on a silicon substrate; and
   wafer-bonding the thinned III-V substrate of the active-device structure onto the thinned III-V mating layer of the high-quality monolithic integration structure.

2. The method of claim 1, wherein the active-device section comprises one or more devices selected from the group consisting of lasers, LEDs, photovoltaics, detectors and transistors.

3. The method of claim 1, wherein the active-device section comprises one or more of an optically-pumped VCSEL and an electrically-pumped VCSEL.

4. The method of claim 1, wherein the active-device section comprises a multiple quantum well (MQW) active region, wherein the MQW active region comprises a material selected from the group consisting of GaSb, AlGaSb, InSb, InGaSb, and InAlSb.

5. The method of claim 1, wherein one or more of the thinned III-V substrate of the active-device structure and the thinned III-V mating layer of the high-quality monolithic integration structure comprise a material selected from the group consisting of GaSb, InSb, GaAs, InP, InAs, AlAs, AlGaAs, InGaSb, and GaN.

6. The method of claim 1, wherein the high-quality monolithic integration structure has a defect density of about $10^6$ cm$^{-2}$ or less and a strain relief of about 98% or higher.

7. The method of claim 1, wherein the thinned III-V mating layer of the high-quality monolithic integration structure has a thickness of about 100 Å or less.

8. The method of claim 1, wherein the interfacial misfit dislocation comprises a 2-dimensional array that is laterally propagated at the interface between the III-V nucleation layer and the silicon substrate of the high-quality monolithic integration structure.

9. The method of claim 1, wherein the III-V nucleation layer of the high-quality monolithic integration structure comprises an AlSb layer.

* * * * *